United States Patent
Shibazaki

(10) Patent No.: US 8,780,667 B2
(45) Date of Patent: Jul. 15, 2014

(54) SEMICONDUCTOR MEMORY DEVICE

(75) Inventor: Yuzuru Shibazaki, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 307 days.

(21) Appl. No.: 13/357,169

(22) Filed: Jan. 24, 2012

(65) Prior Publication Data

US 2013/0010564 A1 Jan. 10, 2013

(30) Foreign Application Priority Data

Jul. 8, 2011 (JP) .................................. 2011-152121

(51) Int. Cl.
*G11C 8/00* (2006.01)

(52) U.S. Cl.
USPC ................................. 365/230.06; 365/230.08

(58) Field of Classification Search
USPC .............. 365/230.06, 230.08, 185.17, 185.23
See application file for complete search history.

(56) References Cited

U.S. PATENT DOCUMENTS

| 2002/0036945 A1* | 3/2002 | Fischer | 365/230.06 |
| 2011/0235424 A1* | 9/2011 | Pyeon et al. | 365/185.17 |
| 2012/0236647 A1* | 9/2012 | Pyeon et al. | 365/185.17 |

FOREIGN PATENT DOCUMENTS

| JP | 2006-22991 | 1/2006 |
| JP | 2007-207301 | 8/2007 |

* cited by examiner

*Primary Examiner* — Vu Le

(74) *Attorney, Agent, or Firm* — Oblon, Spivak, McClelland, Maier & Neustadt, L.L.P.

(57) ABSTRACT

According to the embodiments, a semiconductor memory device includes serially-connected cell transistors includes respective gate electrodes coupled to respective word lines, a first driver and a second driver which drive the word lines, and a connection module. The connection module electrically couples the first driver commonly to a first subset of the word lines, and electrically couples the second driver commonly to a second subset of the word lines different from the first subset of the word lines. The first and second subsets of the word lines include the same number of word lines.

20 Claims, 7 Drawing Sheets

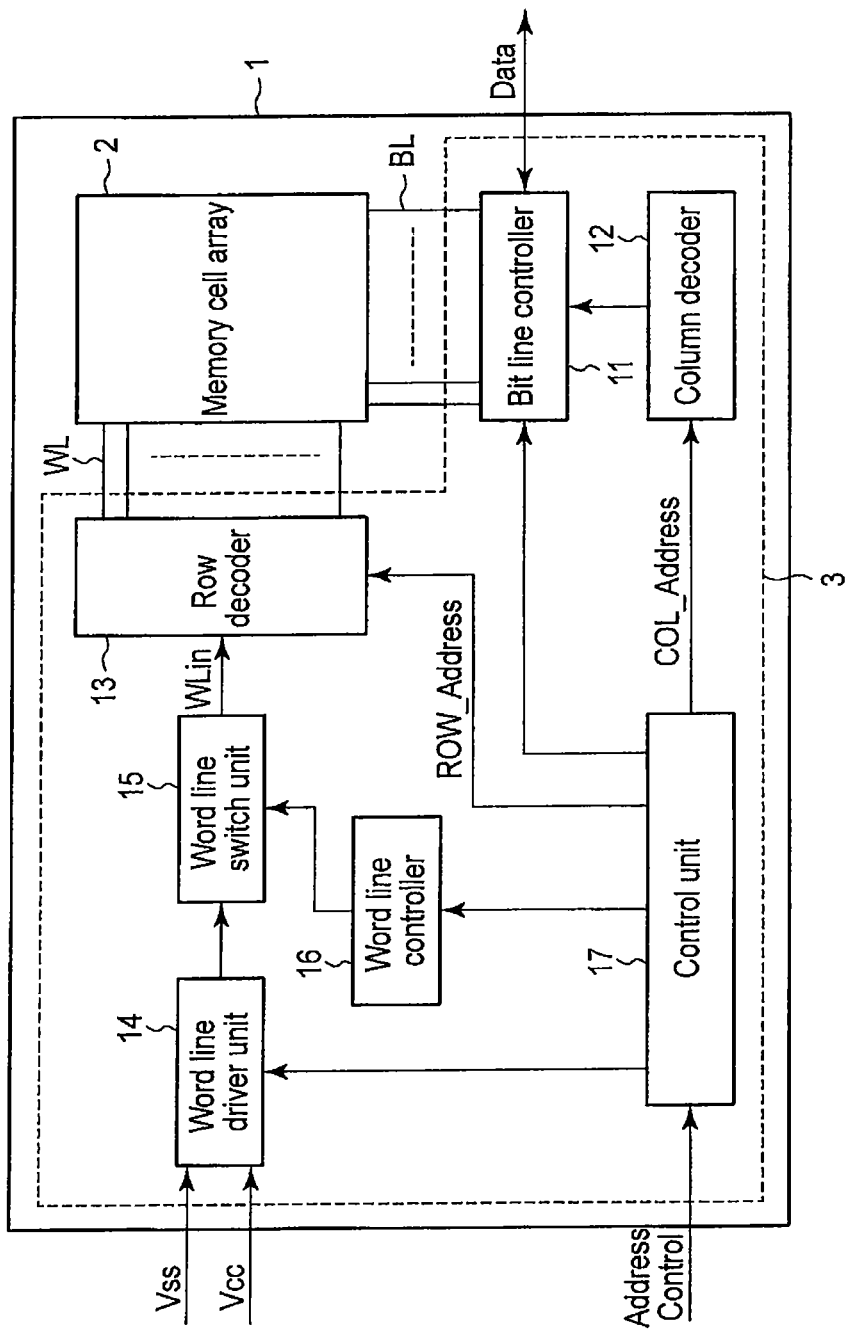
F I G. 1

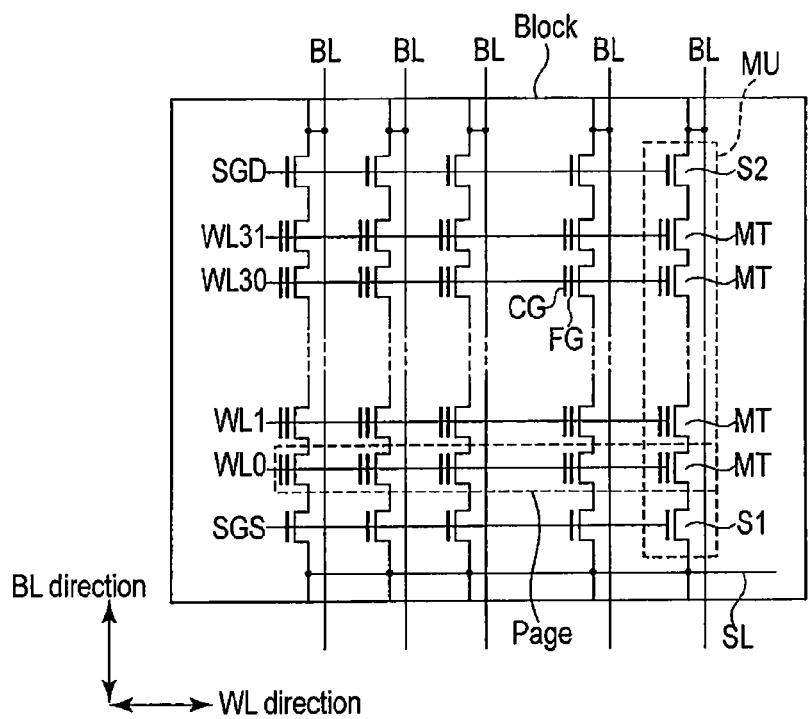
F I G. 2
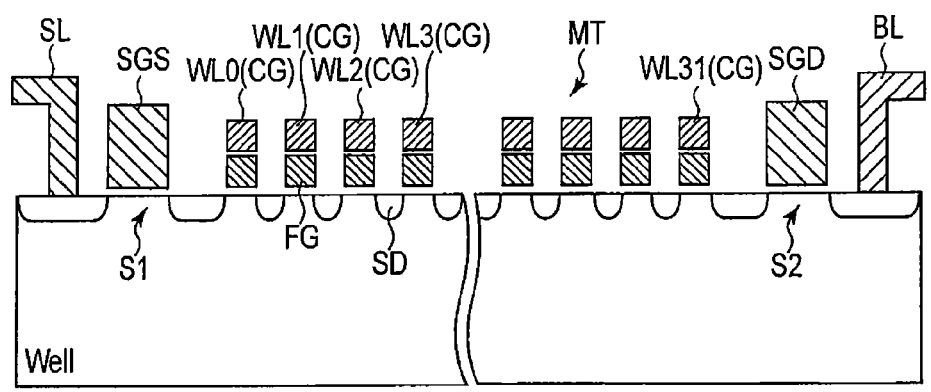
F I G. 3

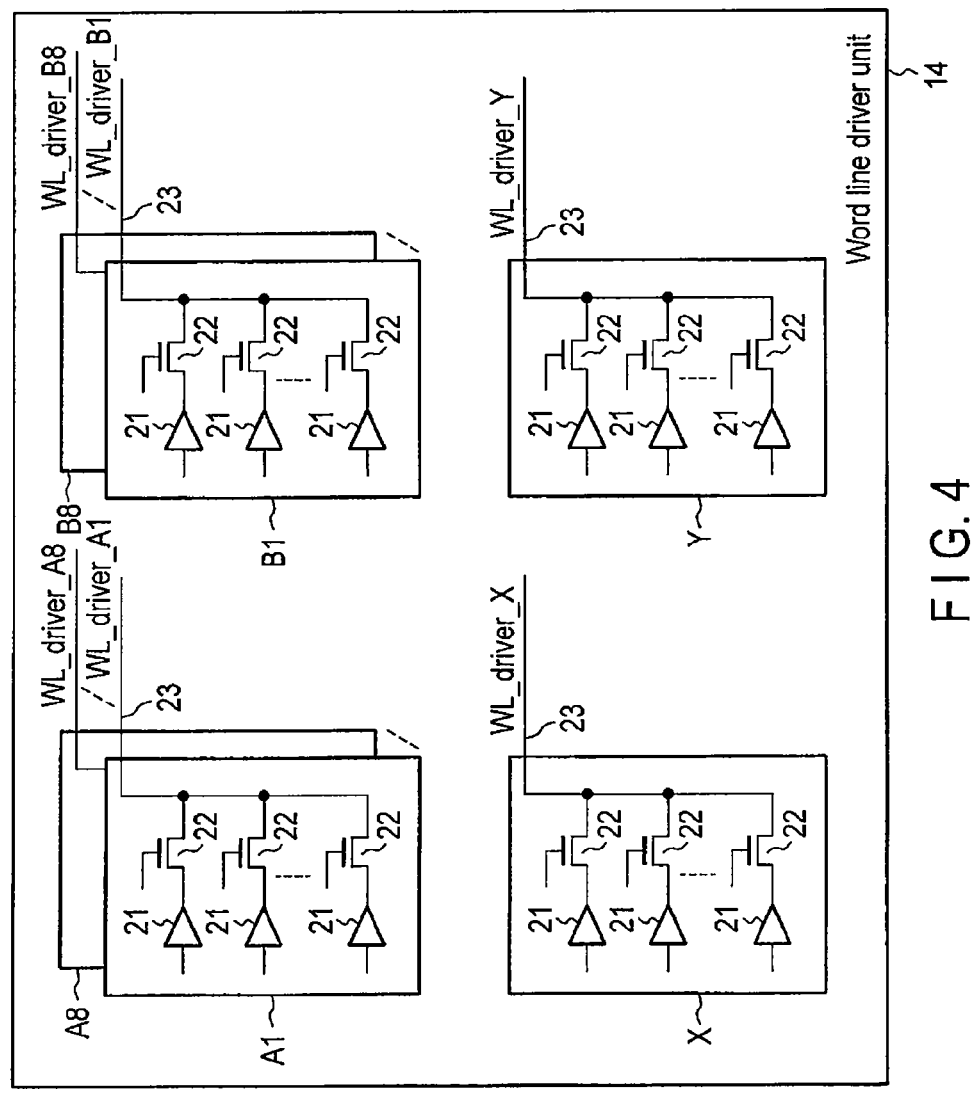
F I G. 4

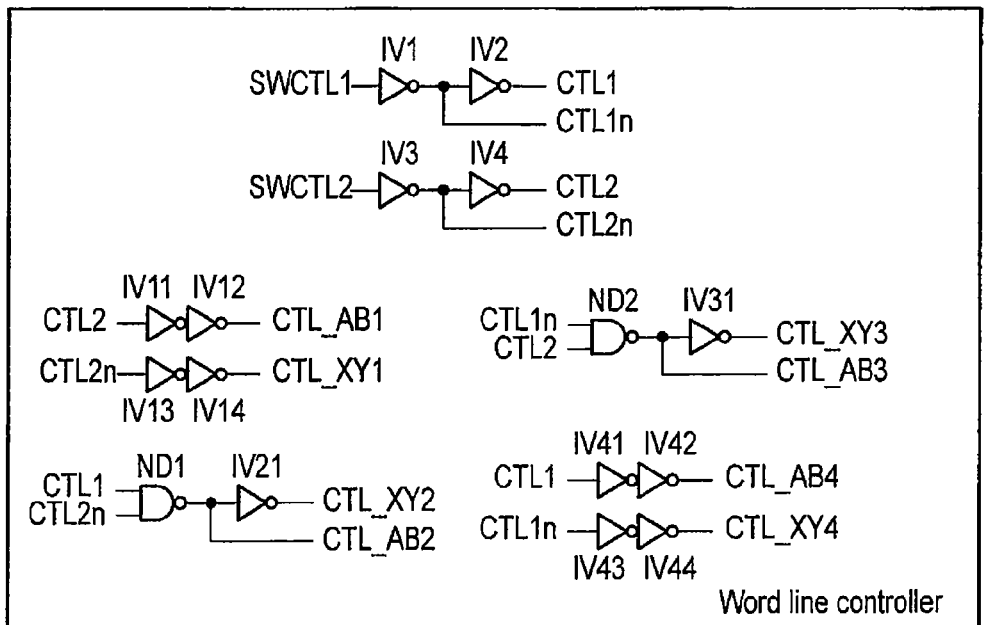
F I G. 6
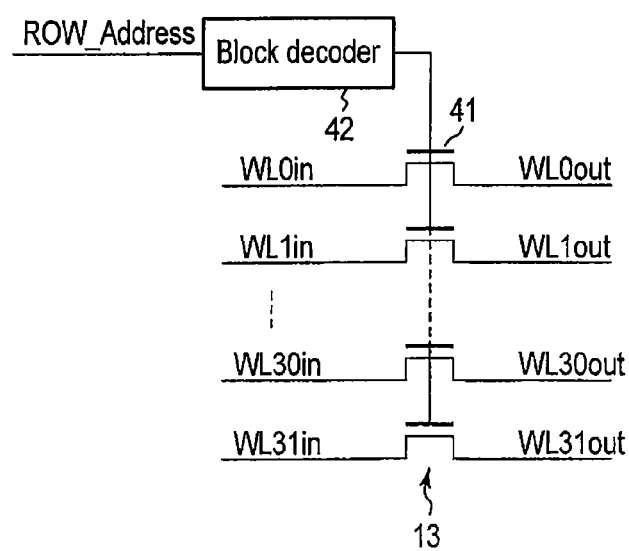
F I G. 7

| SWCTL | | CTL_ABn | | | | CTL_XYn | | | |
|---|---|---|---|---|---|---|---|---|---|
| 2 | 1 | 1 | 2 | 3 | 4 | 1 | 2 | 3 | 4 |
| 1 | 0 | 1 | 1 | 0 | 0 | 0 | 0 | 1 | 1 |
| 0 | 0 | 0 | 1 | 1 | 0 | 1 | 0 | 0 | 1 |
| 0 | 1 | 0 | 0 | 1 | 1 | 1 | 1 | 0 | 0 |

FIG. 9

SEMICONDUCTOR MEMORY DEVICE

CROSS-REFERENCE TO RELATED APPLICATIONS

This application is based upon and claims the benefit of priority from prior Japanese Patent Application No. 2011-152121, filed Jul. 8, 2011, the entire contents of which are incorporated herein by reference.

FIELD

Embodiments described herein relate generally to a semiconductor memory device.

BACKGROUND

A NAND flash memory has strings that include serially-connected memory cells. A group of the bits each held by a memory cell in each string configures a page, which is a unit of reading or writing data in the NAND flash memory. The memory cells which configure one page are coupled to the same word line. There are demands for an operation speed accelerated from the current one for memory devices such as the NAND flash memory.

BRIEF DESCRIPTION OF THE DRAWINGS

FIG. 1 illustrates a block diagram of an entire configuration of a semiconductor memory device according to one embodiment.

FIG. 2 illustrates a circuit diagram of a block.

FIG. 3 illustrates a sectional view of a block.

FIG. 4 illustrates a word line driver unit according to one embodiment.

FIG. 6 illustrates a word line controller according to one embodiment.

FIG. 7 illustrates a row decoder according to one embodiment.

FIG. 9 illustrates a logical value table according to one embodiment.

DETAILED DESCRIPTION

Figure 5:
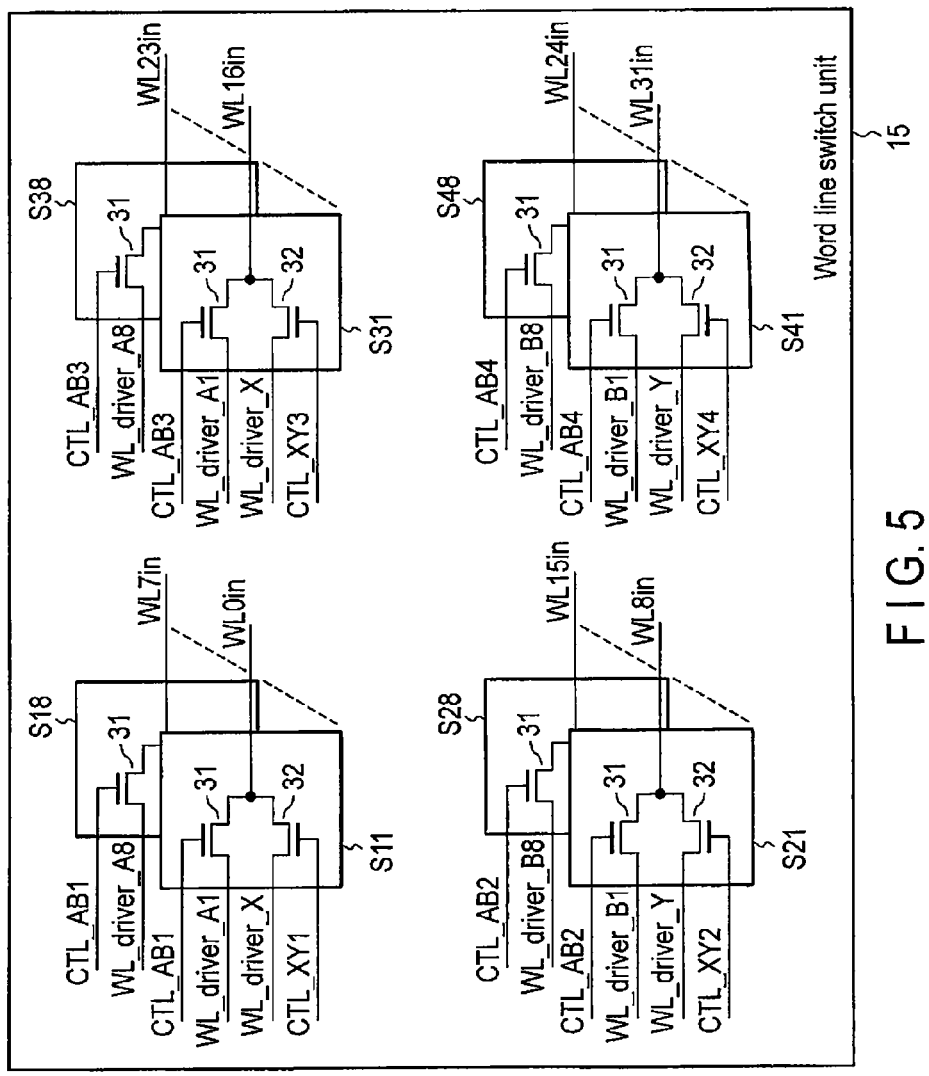
FIG. 5 illustrates a word line switch unit according to one embodiment.

In general, according to one embodiment, a semiconductor memory device includes serially-connected cell transistors comprising respective gate electrodes coupled to respective word lines, a first driver and a second driver which drive the word lines, and a connection module. The connection module electrically couples the first driver commonly to a first subset of the word lines, and electrically couples the second driver commonly to a second subset of the word lines different from the first subset of the word lines. The first and second subsets of the word lines include the same number of word lines.

An example of the NAND flash memory for reference will be described first. When a memory cell is accessed, the word line associated to a page to be accessed is selected. Various voltages may also be applied to word lines other than the selected word line. To this end, more than one drivers may be provided. Each driver may apply various voltages to the selected word line or a non-selected word line. Which voltage is applied and how many word lines are driven by each driver depends on a specific configuration of drivers and word lines. It is possible that word lines to which the same voltage is applied is commonly driven by one driver.

There are various combinations between each driver and word lines driven by this driver. No matter which word line is selected, specific voltages need to be applied to respective non-selected word lines. To this end, it is possible that one driver drives the number of the word lines varied based on a selected word line. With such techniques, varied number of the word lines driven by one driver will result in varied load capacity imposed on that driver. In particular, increased number of commonly driven word lines needs increased time to charge and discharge those word lines. As a result, the time for charging and discharging varies among word lines to which the same voltage needs to be applied.

Embodiments configured based on such knowledge will now be described with reference to drawings. Components which have substantially the same functions and configurations will be referred to with the same reference numerals and repetitive descriptions will be given only when required. Embodiments described in the following illustrate devices and methods for realizing the technical idea of the embodiments, and the technical idea of the embodiments does not limit the materials of component parts, forms, structures, arrangement, etc. to the following ones. The technical idea of the embodiments may be variously changed in accordance with the scope of the claims.

Functional blocks illustrated below do not need to be limited specific examples below. In particular, a specific function described below may be implemented in a functional block other than one described below. A specific functional block may also be divided into sub-blocks. Embodiments are not limited by which functional block implements a particular function.

FIG. 1 schematically illustrates functional blocks of a semiconductor memory device according to one embodiment. As shown in FIG. 1, a semiconductor memory device 1 according to one embodiment includes a memory cell array 2 and a periphery unit (connection unit) 3. The periphery unit or module 3 is equivalent to portions other than the memory cell array 2 of the semiconductor memory device 1. The periphery unit 3 includes a bit line controller 11, a column decoder 12, a row decoder 13, a word line driver unit or module 14, a word line switch unit or module 15, a word line controller 16, and a control unit or module 17.

The memory cell array 2 includes more than one blocks. Each block includes components such as memory cells, word lines WL, and bit lines BL. One block includes more than one pages, and one page includes more than one memory cells. The page may refer to memory space of bits realized by memory cells. The block and page will be described in detail later. The bit lines BL and the word lines WL of the memory cell array 2 are coupled to the bit line controller 11 and the row decoder 13, respectively.

The bit line controller 11 reads data held in the memory cells in the memory cell array 2 through the bit lines BL, and detects a state of each memory cell in the memory cell array 2 through the bit lines BL. The bit line controller 11 applies write voltage, or program voltage, to particular memory cells in the memory cell array 2 through the bit lines BL to write data in them. The bit line controller 11 is coupled to the column decoder 12. The column decoder 12 selects specific bit lines based on a column address COL_ADDRESS. The column address COL_ADDRESS is generated by the control unit 17 based on a signal Address received from outside the semiconductor memory device 1. The bit line controller 11 includes components such as a sense amplifier. Data DATA read from the memory cells to the bit line controller 11 is output to outside the semiconductor memory device 1 from data input/output terminals. Similarly, the bit line controller 11 receives data DATA from outside the semiconductor memory device 1 through the data input/output terminals.

The row decoder 13 selects specific word lines WL in the memory cell array 2 based on a row address ROW_ADDRESS. The row address ROW_ADDRESS is generated by the control unit 17 based on the signal Address. The row decoder 13 receives various voltages required for reading, writing, or erasing data from the word line driver unit 14 through the word line switch unit 15. The row decoder 13 applies the received voltages to specific word lines.

The word line driver unit 14 receives voltages Vss and Vcc from outside the semiconductor memory device 1 to generate various voltages required for reading, writing, or erasing data. The word line driver unit 14 includes more than one drivers. The output of the word line driver unit 14 is coupled to the word line switch unit 15. The word line switch unit 15 respectively couples specific drivers in the word line driver unit 14 to specific word lines WL based on control from the word line controller 16. The word line driver unit 14, word line switch unit 15, and word line controller 16 will be described in detail later.

The semiconductor memory device 1 also receives various signals such as the address Address and a control signal Control. The control unit 17 receives and used these signals to control the semiconductor memory device 1. The control unit 17 controls the bit line controller 11, column decoder 12, row decoder 13, word line driver unit 14, and word line controller 16.

FIGS. 2 and 3 illustrate an example configuration of the block Block. Only one block Block is illustrated in FIG. 2. As shown in FIGS. 2 and 3, the block Block includes memory cell columns, or memory cell units MU aligning along the word-line direction (WL direction). The memory cell columns MU extend along the bit-line direction (BL direction). One memory cell column MU includes a NAND string, and select transistors S1 and S2. The NAND string includes memory cell transistors (for example, 32 transistors) MT whose current paths (source/drains SD) are serially connected. The select transistors S1 and S2 are coupled to respective ends of one NAND string. The other end of the current path of the select transistor S2 is coupled to one bit line BL, and the other end of the current path of the select transistor S1 is coupled to a source line SL.

The word lines WL0 to WL31 extend along the WL direction, and each of them are coupled to memory cell transistors MT belonging to the same row. A select gate line SGD extends along the WL direction, and is coupled to all select transistors S2 in one block. A select gate line SGS extends along the WL direction, and is coupled to all select transistors S1 in one block.

A group of bits by the respective memory cell transistors MT coupled to the same word line WL configure one page. Data is read or written in units of pages. For multi-level memory cells, each of which can store data of two or more bits, two or more pages are assigned to one word line.

The memory cells MT are provided in respective intersections of bit lines BL and word lines WL. The memory cells MT are provided on a well in a semiconductor substrate. The memory cell MT has a tunnel insulation film (not shown) on the well, a floating electrode (floating gate electrode) FG as a charge storage layer on the tunnel insulation film, an inter-gate insulation film (not shown) on the floating electrode, and a control electrode (control gate electrode) CG (word line WL) on the inter-gate insulation film, and source/drain areas SD. The source/drain, which forms the current path of the memory cell MT, is serially connected to the source/drain of the adjacent memory cell MT. The select transistors S1 and S2 each include a gate insulation film (not shown) on the semiconductor substrate, a gate electrode SGS or SGD on the gate insulation film, and source/drain areas SD.

Referring to FIG. 4, the word line driver unit 14 will now be described. FIG. 4 illustrates an example of the word line driver unit 14 according to one embodiment. As shown in FIG. 4, the word line driver unit 14 includes more than one word line drivers. More specifically, the word line driver unit 14 includes at least a word line driver X and a word line driver Y.

The word line driver unit 14 further includes eight word line drivers A1 to A8 and eight word line drivers B1 to B8.

The word line drivers A1 to A8, B1 to B8, X, and Y have the same components and connections. However, the outputs of the word line drivers A1 to A8 are referred to as WL_driver_A1 to WL_driver_A8, respectively. Further, the outputs of the word line drivers B1 to B8 are referred to as WL_driver_B1 to WL_driver_B8, respectively. Hereinafter, the word line drivers A1 to A8 are referred to as the word line driver A as their representative or as a whole when they do not need to be identified individually. Similarly, the word line drivers B1 to B8 are referred to as the word line driver B when they do not need to be identified individually.

Each word line driver A, B, X, and Y includes more than one drivers 21. Each driver 21 uses the voltages Vcc and Vss to output a specific voltage, for example, 8V, and 10V. Each driver 21 is coupled to one end of one of switches 22. Each switch 22 is, e.g., an n-type metal oxide semiconductor field effect transistor (MOSFET), and is turned on or off by the control unit 17. The other end of each switch 22 is commonly coupled to the output end 23. The voltage from the driver 21 selected by the control unit 17 appears on the output 23. Thus, selected one of voltages appears on the output 23. Individual control of the word line drivers A, B, X, and Y can produce different voltages on respective outputs 23 of word line drivers A, B, X, and Y. Further, individual control of the word line drivers A1 to A8 can produce different voltages on respective outputs 23 of the word line drivers A1 to A8. Individual control of the word line drivers B1 to B8 can produce different voltages on respective outputs 23 of the word line drivers B1 to B8.

Referring to FIG. 5, the word line switch unit 15 will now be described. FIG. 5 illustrates an example of the word line switch unit 15 according to one embodiment. As shown in FIG. 5, the word line switch unit 15 includes switching circuits S11 to S18, S21 to S28, S31 to S38, and S41 to S48. All switching circuits S11 to S18, S21 to S28, S31 to S38, and S41 to S48 have the same configuration. However, different switching circuits are coupled to different nodes. Hereinafter, the switching circuits S11 to S18, S21 to S28, S31 to S38, and S41 to S48 are referred to as the switching circuit S as their representative or as a whole when they do not need to be identified individually.

The switching circuit S has the two switches 31 and 32 each of which has one end coupled to each other. Each of the switches 31 and 32 is, e.g., an n-type MOSFET. The interconnection node of the switches 31 and 32 serves as an output of the switching circuit S. The other end of each of the switches 31 and 32 serves as inputs of the switching circuit S. Hereinafter, the other end of each of the switches 31 and 32 is referred to as a first input and a second input, respectively. Similarly, a control node of each of the switches 31 and 32 is referred to as a first control input and a second control input, respectively. When the switches 31 and 32 are NMOSFETs, their control node is the gate electrode.

The first inputs of the switching circuits S11 to S18 receive the outputs WL_driver_A1 to WL_driver_A8 of the word line drivers A1 to A8, respectively. All second inputs of the switching circuits S11 to S18 receive the output WL_driver_X of the word line driver X. All first control inputs of the switching circuits S11 to S18 receive the signal CTL_AB1. All second control inputs of the switching circuits S11 to S18 receive the signal CTL_XY1. The switching circuits S11 to S18 output signals WL0in to WL7in, respectively.

The first inputs of the switching circuits S21 to S28 receive the outputs WL_driver_B1 to WL_driver_B8 of the word line drivers B1 to B8, respectively. All second inputs of the switching circuits S21 to S28 receive the output WL_driver_Y of the word line driver Y. All first control inputs of the switching circuits S21 to S28 receive the signal CTL_AB2. All second control inputs of the switching circuits S21 to S28 receive the signal CTL_XY2. The switching circuits S21 to S28 output signals WL8in to WL15in, respectively.

The first inputs of the switching circuits S31 to S38 receive the outputs WL_driver_A1 to WL_driver_A8 of the word line drivers A1 to A8, respectively. All second inputs of the switching circuits S31 to S38 receive the output WL_driver_X of the word line driver X. All first control inputs of the switching circuits S31 to S38 receive the signal CTL_AB3. All second control inputs of the switching circuits S31 to S38 receive the signal CTL_XY3. The switching circuits S31 to S38 output signals WL16in to WL23in, respectively.

The first inputs of the switching circuits S41 to S48 receive the outputs WL_driver_B1 to WL_driver_D8 of the word line drivers B1 to B8, respectively. All second inputs of the switching circuits S41 to S48 receive the output WL_driver_Y of the word line driver Y. All first control inputs of the switching circuits S41 to S48 receive the signal CTL_AB4. All second control inputs of the switching circuits S41 to S48 receive the signal CTL_XY4. The switching circuits S41 to S48 output signals WL24in to WL31in, respectively.

Referring to FIG. 6, the word line controller 16 will now be described. FIG. 6 illustrates an example of the word line controller 16 according to one embodiment. The word line controller 16 has a configuration shown in FIG. 6, and generates signals CTL_AB1, CTL_AB2, CTL_AB3, CTL_AB4, CTL_XY1, CTL_XY2, CTL_XY3 and CTL_XY4. As shown in FIG. 6, the word line controller 16 includes serially-connected inverters IV1 and IV2. The inverter IV1 receives a signal SWCTL1. The output of the inverter IV1 serves as a signal CTL1n and is input to the inverter IV2. The output of the inverter IV2 serves as a signal CTL1.

The word line controller 16 also includes serially-connected inverters IV3 and IV4. The inverter IV3 receives a signal SWCTL2. The output of the inverter IV3 serves as a signal CTL2n and is input to the inverter IV4. The output of the inverter IV4 serves as a signal CTL2.

The signal CTL2 passed through the serially-connected inverters IV11 and IV12 serves as the signal CTL_AB1. The signal CTL2n passed through the serially-connected inverters IV13 and IV14 serves as the signal CTL_XY1. The signals CTL1 and CTL2n are input to a NAND gate ND1. The output of the NAND gate ND1 serves as the signal CTL_AB2 and is input to an inverter IV21. The output of the inverter IV21 serves as the signal CTL_XY2.

The signals CTL1n and CTL2 are input to a NAND gate ND2. The output of the NAND gate ND2 serves as the signal CTL_AB3 and is input to the inverter IV31. The output of the inverter IV31 serves as the signal CTL_XY3. The signal CTL1 passed through the serially-connected inverters IV41 and IV42 serves as the signal CTL_AB4. The signal CTL1n passed through the serially-connected inverters IV43 and IV44 serves as the signal CTL_XY4.

The signals SWCTL1 and SWCTL2 are supplied from the control unit 17. The control unit 17 controls logics of the signals SWCTL1 and SWCTL2 based on the selected word line WL.

Referring to FIG. 7, the row decoder 13 will now be described. FIG. 7 illustrates an example of the row decoder 13 according to one embodiment. The row decoder 13 includes switches 41 and a block decoder 42. The row decoder 13 includes as many switches 41 as the memory cells in one NAND string, i.e., 32 switches in this context. Each switch 41 is, e.g., an n-type MOSFET. One end of each switch 41 receives signal WL0in to WL31in, respectively. The other end of each of switches 41 which respectively receives signals WL0in to WL31in outputs signals WL0out to WL31out, respectively. The signals WL0out to WL31out are supplied to the word lines WL0 to WL31, respectively. The control node (gate) of each switch 41 is coupled to the block decoder 42.

The row decoder 13 transfers a block selection signal from the block decoder 42 to the switches 41. The block decoder 42 receives the row address ROW_ADDRESS from the control unit 17, and outputs the block selection signal based on the row address ROW_ADDRESS. Based on the block selection signal, switches 41 for one block will be turned on or off.

Figure 8:
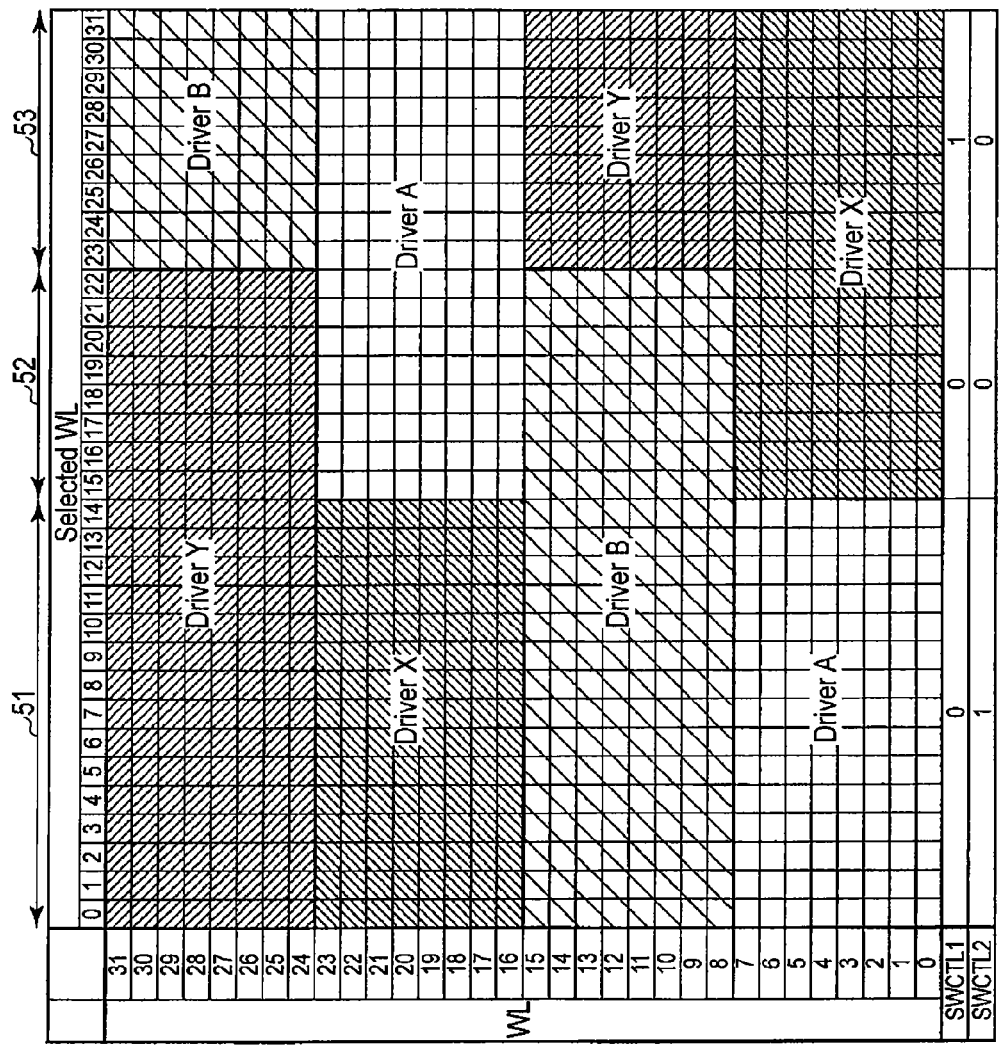
FIG. 8 illustrates connections between word lines and word line drivers based on selected word lines according to one embodiment.

Referring to FIGS. 8 and 9, operations of the semiconductor memory device of the configuration described above will now be described. FIG. 8 illustrates connections between particular word lines and word line drivers based on selected word lines according to one embodiment. The word lines aligned along the lateral direction in FIG. 8 represent selected word lines. The word lines aligned along the vertical direction indicate to which word line driver they are coupled for one selected word line. For example, for a case where the word line WL5 is selected, the word lines WL0 to WL7 are driven by the word line driver A, the word lines WL8 to WL15 are driven by the word line driver B, the word lines WL16 to W23 are driven by the word line driver X, the word lines WL24 to WL31 are driven by the word line driver Y.

The control unit 17 learns the selected word line from the address Address, and determines the logics of the signals SWCTL1 and SWCTL2 based on the selected word line. In particular, as shown in FIG. 8, the control unit 17 sets the signals SWCTL1 and SWCTL2 to "0" and "1", or asserted and de-asserted, respectively, when one of the word lines WL0 to WL14 is selected (case 51). The control unit 17 sets both the signals SWCTL1 and SWCTL2 to "0" when one of the word lines WL15 to WL22 is selected (case 52). The control unit 17 sets the signals SWCTL1 and SWCTL2 to "1" and "0", respectively, when one of the word lines WL23 to WL31 is selected (case 53).

As described above, the combination of the logics of the signals SWCTL1 and SWCTL2 is determined based on the cases 51, 52, and 53. The signals CTL_AB1 to CTL_AB4 and CTL_XY1 to CTL_XY4 of specific logics are in turn generated by the word line controller 16 based on the logics of the signals SWCTL1 and SWCTL2. FIG. 9 illustrates the logics of the signals CTL_AB1 to CTL_AB4 and CTL_XY1 to CTL_XY4 based on the combination of the logics of the signals SWCTL1 and SWCTL2. As shown in FIG. 9, when the signals SWCTL1 and SWCTL2 are "0" and "1", respectively (i.e., for the case 51), the signals CTL_AB1 to CTL_AB4 are "1", "1", "0" and "0", respectively, and the signals CTL_XY1 to CTL_XY4 are "0", "0", "1" and "1", respectively. The word line switch unit 15 operates in accordance with these logics, and each word line WL is electrically coupled to the output of a specific one of the word line drivers A, B, X, and Y. Specifically, the word line driver outputs WL_driver_A1 to A8 are selected as the outputs WL1in to WL8in of FIG. 5, respectively, and are electrically coupled to the word lines WL0 to WL7 via the row decoder 13 of FIG. 7, respectively. Similarly, the word line driver outputs WL_driver_B1 to B8 are electrically coupled to the word lines WL8 to WL15, respectively. The word line driver output WL_driver_X is commonly electrically coupled to the word lines WL16 to WL23. The word line driver output WL_driver_Y is commonly electrically coupled to the word lines WL24 to WL31. This state is graphically illustrated in FIG. 8. More particularly, in the case 51, WL0 to WL7 are driven by the word line driver A, WL8 to WL15 are driven by the word line driver B, WL16 to WL23 are driven by the word line driver X, and WL24 to WL31 are driven by the word line driver Y.

The word line driver A includes eight word line drivers A1 to A8 as described above. Therefore, the potentials of the word lines WL0 to WL7 respectively driven by the word line drivers A1 to A8 can be individually controlled. Similarly, the potentials of the word lines WL8 to WL15 respectively driven by the word line drivers B1 to B8 can be individually controlled. Therefore, the present embodiment can be combined with techniques which apply different potentials to different non-selected word lines. In contrast, the word lines WL16 to WL23 driven by one word line driver X are controlled to the same potential. Similarly, the word lines WL24 to WL31 driven by one word line driver Y are controlled to the same potential.

Thus, eight word lines WL are driven by one word line driver X or Y. That is, each of the word line drivers X and Y, which drives two or more word lines WL, drives the same number (eight in this context) of word lines regardless of the selected word line.

Similarly, as shown in FIG. 9, in a case where both the signals SWCTL1 and SWCTL2 are "0" (i.e., in the case 52), the signals CTL_AB1 to CTL_AB4 are "0", "1", "1" and "0", respectively, and the signals CTL_XY1 to CTL_XY4 are "1", "0", "0" and "1", respectively. As a result, as shown in FIG. 8, the word lines WL0 to WL7 are driven by the word line driver X, the word lines WL8 to WL15 are driven by the word line driver B, the word lines WL16 to WL23 are driven by the word line driver A, and the word lines WL24 to WL31 are driven by the word line driver Y. Each of the word line drivers X and Y, which drives two or more word lines WL, drives the same number (eight in this context) of the word lines regardless of the selected word line as in the case 51.

Furthermore, as shown in FIG. 9, in a case where the signals SWCTL1 and SWCTL2 are "1" and "0", respectively (i.e., in the case 53), the signals CTL_AB1 to CTL_AB4 are "0", "0", "1" and "1", respectively, and the signals CTL_XY1 to CTL_XY4 are "1", "1", "0" and "0", respectively. As a result, as shown in FIG. 8, the word lines WL0 to WL7 are driven by the word line driver X, the word lines WL8 to WL15 are driven by the word line driver Y, the word lines WL16 to WL23 are driven by the word line driver A, and the word lines WL24 to WL31 are driven by the word line driver B. Each of the word line drivers X and Y, which drives two or more word lines WL, drives the same number (eight in this example) of the word lines regardless of the selected word line.

As described above and can be seen from FIG. 8, each of the word line drivers X and Y, which drives two or more word lines WL, drives the same number of the word lines in any of the cases 51 to 53. Therefore, each of the word line drivers X and Y always drives the same number of word lines regardless of the selected word line.

In contrast, two or more word lines can be driven by one word line driver differently from the present embodiment. More particularly, the combination of one word line driver and word lines driven by it is fixed, for example. When applied such a technique to the above specific example and FIG. 8, the word lines WL0 to WL15 would be driven by one word line driver a whenever they are simultaneously driven. The word lines WL16 to WL31 would be driven by another word line driver β. Such combinations result in the word line drivers α and β driving varying number of word lines based on a selected word line. Specifically, the word line driver α drives the eight word lines WL0 to WL7 for the case of the word lines WL15 to WL22 selected, and the sixteen word lines WL0 to WL15 for the case of the word lines WL23 to WL31 selected. The same holds true for the word line driver β. As a result, a load capacity for a word line driver varies, which in turn results in varying charge or discharge time of the word lines. With such a phenomenon, timings among components in the semiconductor memory device must be determined based on the latest charge or discharge case, and operation timings of a quick charge or discharge case would be restricted to the latest case. In contrast, according to the present embodiments, the word line drivers which drive two or more word lines drive the same number of the word lines regardless of the selected word line.

Note that various specific examples are used for describing embodiments. However, embodiments are not limited to them. For example, the above description is for NAND strings having thirty-two memory cell transistors MT, and the control signals SWCTL1 and SWCTL2 are used based on such example. The present embodiments, however, can be applied to NAND strings including more memory cell transistors. To this end, more than two word line drivers which drive two or more word lines can be provided. Accordingly, additional control signal can be used in addition to the control signals SWCTL1 and SWCTL2. With appropriate combinations of logics of such control signals, a semiconductor memory device including NAND strings with any number of memory cell transistors can be configured so that the word line drivers which drive two or more word lines always drive the same number of the word lines regardless of the selected word line. The word line switch unit 15 and word line controller 16 are also appropriately modified based on the disclosed principles of the specification if necessary.

Moreover, which non-selected word lines are driven by a common word line driver is not limited to the above example. In particular, in the above context, a word line driver drives the non-selected word lines separated from the selected word line by more the seven or eight word lines. This number depends on how many word lines next to the selected word line need to have their potential controlled individually. This difference of control may result in the distance other than seven or eight word lines used above. Moreover, the word line drivers A and B are provided as word line drivers with individual potential control capability; however such classification is not essential. Any classification is possible so long as the periphery unit (connection unit) 2 (in particular, word line switch unit 15) is configured to couple each word line WL to selected one of one word line drivers which drives two or more word lines WL (a word line driver X or Y) and a word line driver which drives one word line WL (a word line driver A or B). Furthermore, the eight word line drivers A1 to A8 and the eight word line drivers B1 to B8 result at least in part from one NAND string including thirty-two memory cell transistors MT and the use of four kinds of word line drivers A, B, and X and Y. More particularly, since thirty-two word lines are driven by four kinds of word line drivers A, B, and X and Y, each word line driver A, B, X and Y drives eight word lines. Then, the word line driver A includes eight word line drivers A1 to A8 in order to allow them to drive each word line individually. Similarly, the word line driver B includes the eight word line drivers B1 to B8 in order to allow them to drive each word line WL individually. Therefore, for an example NAND string including more or less than thirty-two memory cell transistors MT, the word line drivers A and B may include more or less than eight word line drivers, and the number of word line drivers are not limited to the example above. Similarly, more or less than eight word lines WL may be commonly driven by the word line drivers X or Y.

As described above, in the semiconductor memory device according to one embodiment, the word line driver which drives two or more word lines drives a fixed number of the word lines regardless of the selected word line. This results in a fixed amount of load capacity to the word line regardless of the selected word line. This can avoid variation of time for charging and discharging the word lines due to varying load capacity, prevent suppression of possible quick operation to slow one, and allows for high-speed operation as a whole.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
cell transistors comprising respective gate electrodes coupled to respective word lines;
a first driver and a second driver which drive the word lines; and
a connection module which electrically couples the first driver commonly to a first subset of the word lines, and electrically couples the second driver commonly to a second subset of the word lines different from the first subset of the word lines, the first and second subsets of the word lines including the same number of word lines.

2. The device of claim 1, wherein
the first subset of the word lines are apart from a selected word line by one or more of the word lines and include adjacent ones of the word lines,
the second subset of the word lines are apart from the selected word line by one or more of the word lines and include adjacent ones of the word lines.

3. The device of claim 2 further comprising third drivers which drive word lines electrically coupled to the third drivers, wherein
the connection module electrically couples the third drivers to a third subset of the word lines respectively, and the third subset of the word lines is different from the first and second subsets of the word lines and include the selected word line.

4. The device of claim 3, wherein
the connection module includes connection circuits for respective word lines,
each of some of the connection circuits electrically couples one corresponding word line to either one of one corresponding third driver or the first driver based on the selected word line, and
each of the rest of the connection circuits electrically couples one corresponding word line to either one of one corresponding third driver or the second driver based on the selected word line.

5. The device of claim 4, wherein
the connection module comprises a logic circuit which generates a signal to control the connection circuits based on a signal for identifying the selected word line.

6. The device of claim 5, wherein
the third drivers include fourth drivers and fifth drivers.

7. The device of claim 6, wherein
each of said some of the connection circuits electrically couples one corresponding word line to either one of one corresponding fourth driver or the first driver based on the selected word line, and
each of the rest of the connection circuits electrically couples one corresponding word line to either one of one corresponding fifth driver or the second driver based on the selected word line.

8. The device of claim 7, wherein
said some of the connection circuits include a first subset, a second subset, a third subset, and a fourth subset of the connection circuits,
while each of the first subset of the connection circuits electrically couples one corresponding word line to one of one corresponding fourth driver and the first driver, each of the second subset of the connection circuits electrically couples one corresponding word line to the other one of one corresponding fourth driver and the first driver, and
while each of the third subset of the connection circuits electrically couples one corresponding word line to one of one corresponding fifth driver and the second driver, each of the fourth subset of the connection circuits electrically couples one corresponding word line to the other one of one corresponding fifth driver and the second driver.

9. The device of claim 8, wherein
each of the first driver, second driver, and third drivers outputs a selected one of voltages.

10. The device of claim 9, wherein
the third drivers are configured to output different voltages.

11. The device of claim 10, wherein
the cell transistors are serially-connected.

12. A semiconductor memory device comprising:
cell transistors comprising respective gate electrodes coupled to respective word lines;
first means for driving the word lines;
second means for driving the word lines; and
means for electrically coupling the first means for driving commonly to a first subset of the word lines, and electrically coupling the second means for driving commonly to a second subset of the word lines different from the first subset of the word lines, the first and second subsets of the word lines including the same number of word lines.

13. The device of claim 12, wherein
the first subset of the word lines are apart from a selected word line by one or more of the word lines and include adjacent ones of the word lines,
the second subset of the word lines are apart from the selected word line by one or more of the word lines and include adjacent ones of the word lines.

14. The device of claim 13 further comprising a plurality of third means for driving word lines electrically coupled to the plurality of third means for driving, wherein the means for electrically coupling electrically couples the plurality of third means for driving to a third subset of the word lines respectively, and the third subset of the word lines is different from the first and second subsets of the word lines and include the selected word line.

15. The device of claim 14, wherein the means for electrically coupling includes connection circuits for respective word lines, each of some of the connection circuits electrically couples one corresponding word line to either one of one corresponding third means for driving or the first means for driving based on the selected word line, and each of the rest of the connection circuits electrically couples one corresponding word line to either one of one corresponding third means for driving or the second means for driving based on the selected word line.

16. The device of claim 15, wherein the means for electrically coupling comprises a logic circuit which generates a signal to control the connection circuits based on a signal for identifying the selected word line.

17. The device of claim 16, wherein the plurality of third means for driving include a plurality of fourth means for driving and a plurality of fifth means for driving.

18. The device of claim 17, wherein each of said some of the connection circuits electrically couples one corresponding word line to either one of one corresponding fourth means for driving or the first means for driving based on the selected word line, and each of the rest of the connection circuits electrically couples one corresponding word line to either one of one corresponding fifth means for driving or the second means for driving based on the selected word line.

19. The device of claim 18, wherein said some of the connection circuits include a first subset, a second subset, a third subset, and a fourth subset of the connection circuits, while each of the first subset of the connection circuits electrically couples one corresponding word line to one of one corresponding fourth means for driving and the first means for driving, each of the second subset of the connection circuits electrically couples one corresponding word line to the other one of one corresponding fourth means for driving and the first means for driving, and while each of the third subset of the connection circuits electrically couples one corresponding word line to one of one corresponding fifth means for driving and the second means for driving, each of the fourth subset of the connection circuits electrically couples one corresponding word line to the other one of one corresponding fifth means for driving and the second means for driving.

20. The device of claim 19, wherein each of the first means for driving, second means for driving, and the plurality of third means for driving outputs a selected one of voltages.

\* \* \* \* \*